(12) United States Patent
Soga et al.

(10) Patent No.: US 6,604,431 B1
(45) Date of Patent: Aug. 12, 2003

(54) APPARATUS AND METHOD FOR FIXING AND CHECKING CONNECTIONS OF PIEZOELECTRIC SENSOR, ACTUATOR, AND DISK UNIT

(75) Inventors: Eiji Soga, Yamato (JP); Shingo Tsuda, Yokohama (JP); Kiyoshi Satoh, Fujisawa (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/618,987

(22) Filed: Jul. 19, 2000

(30) Foreign Application Priority Data

Sep. 29, 1999 (JP) ............................................ 11-275883

(51) Int. Cl.7 ................................................ G01B 7/16
(52) U.S. Cl. ............................................ 73/777; 347/70
(58) Field of Search ........................... 73/763; 428/1.32, 428/1.52, 1.6; 702/47; 438/689–757

(56) References Cited

U.S. PATENT DOCUMENTS

| | | | |
|---|---|---|---|
| 5,546,008 A | 8/1996 | Sminchak et al. | .......... 324/690 |
| 6,142,614 A | * 11/2000 | Hashizume et al. | .......... 347/70 |

FOREIGN PATENT DOCUMENTS

| | | | | |
|---|---|---|---|---|
| EP | 398031 | 11/1990 | ............ | B41J/2/135 |
| GB | 2 345 380 A | 7/2000 | ............ | H01L/41/24 |
| JP | 02-261058 | 9/1922 | ............ | G11B/5/596 |
| JP | 5-55656 A | 3/1993 | | |
| JP | 09082048 A | 3/1997 | | |
| JP | 10154834 A | 6/1998 | | |
| JP | 10215139 A | 8/1998 | | |
| JP | 11231012 A | 9/1999 | ............ | G01R/31/02 |
| WO | WO 98/03134 | 1/1998 | ............ | A61F/2/18 |

\* cited by examiner

*Primary Examiner*—Hezron Williams
*Assistant Examiner*—Andre Allen
(74) *Attorney, Agent, or Firm*—Robert B. Martin; Bracewell & Patterson, L.L.P.

(57) ABSTRACT

To provide a piezoelectric sensor that never sacrifices work properties such as when a lead wire is to be soldered to one of a pair of electrodes of a piezoelectric sensor, and the other electrode is to be bonded and fixed to a predetermined member with an adhesive, and to bond the ground electrode of the piezoelectric sensor to the conductive portion of the object member with an adhesive so as to be fixed and connected electrically, thereby preventing a short-circuit that might occur between the two electrodes due to extruded and stuck adhesive, and to provide an easier method for testing whether or not the ground electrode is connected electrically to the conductive portion of the object member. A piezoelectric sensor has two electrodes that are formed with different materials appropriate for soldering and bonding by an adhesive. The ground electrode of the piezoelectric sensor is bonded to the object member with a non-conductive adhesive so as to be connected electrically. Furthermore, the capacity between the output electrode of the piezoelectric sensor and the object member is measured to check the electrical connection between the ground electrode and the object member.

2 Claims, 5 Drawing Sheets

APPARATUS AND METHOD FOR FIXING AND CHECKING CONNECTIONS OF PIEZOELECTRIC SENSOR, ACTUATOR, AND DISK UNIT

BACKGROUND OF THE INVENTION

1. Technical Field:

The present invention relates to a piezoelectric sensor, an actuator whose distortion information is detected by this piezoelectric sensor, and a disk unit used for suppressing the distortion of the actuator according to the detected distortion information. More particularly, the present invention relates to a method for fixing the piezoelectric sensor to the actuator and checking the status of the electrical connection at the fixed portion.

2. Description of the Related Art:

Conventionally, electrodes have been formed on a thin plate-like piezoelectric element by plating those electrodes with such a conductive material as gold, nickel, tin, or the like. Generally, a pair of electrodes are formed with the same material in such a case. However, among those electrode materials, there have not been any materials that excel in both wettability required for soldering and adhesion required for bonding with an adhesive.

Basically, an adhesive is required to have the following characteristics: (1) The adhesive must flow smoothly. (2) The adhesive must flow into small spaces. (3) The adhesive must get electrode materials wet properly. (4) Finally, the adhesive must be set so as to form a tough layer and keep a high adhesion. More concretely, an adhesive must be fluid once. For example, it should preferably get the object electrode material wet with a low surface tension of liquid.

For example, gold has excellent wettability, but not excellent adhesion. On the contrary, nickel has excellent adhesion, but not excellent wettability. Consequently, in case of such the conventional technique, if a lead wire is to be soldered on one electrode of a piezoelectric sensor and the other electrode is to be bonded and fixed at a predetermined member thereof, either of the work properties must be sacrificed.

Under such the circumstances, the Applicant of the present invention has invented a method for bonding a piezoelectric sensor to a distortion detecting spot of an object member and examined the idea as follows. The piezoelectric sensor was provided with two electrodes, which are plated with nickel for excellent adhesion, and bonded at a distortion detecting spot of the object member with an adhesive as shown in FIGS. 9 and 10. (The configurations of the piezoelectric sensor shown in FIGS. 9 and 10 are unknown in the prior art; they are not included in any conventional techniques.)

The piezoelectric sensor 51 shown in FIG. 9 is structured so that the top and bottom surfaces of the piezoelectric element 51a are placed between nickel-plated electrodes. The electrode formed on the top surface is used as an output electrode 51b of the piezoelectric sensor and the electrode formed on the bottom surface is used to a ground electrode 51c thereof. The electrode 51c is used as a reference potential surface of the piezoelectric sensor. The surface of the ground electrode 51c is bonded to a distortion detecting spot of the object member 57 with an adhesive 56. In such a structure of the piezoelectric sensor, however, the adhesive surface of the ground electrode 51c is hidden completely. To avoid this, therefore, part of the ground electrode 51c is extended up to the top surface of the piezoelectric element and a lead 54 for taking out the reference potential is soldered at this portion.

In such a configuration, although the ground electrode 51c is grounded surely via the lead 54, the lead wire must be soldered to two electrodes of both output electrode 51b and ground electrode 51c. In addition, a special process is needed for extending part of the ground electrode 51c up to the top surface of the piezoelectric element. And, some more measures are further needed to improve both workability and cost of the piezoelectric sensor.

The bonding method shown in FIG. 10 is based on an idea that at least the predetermined distortion detecting spot of the object member 65 is formed with a conductive material and the predetermined spot is grounded. The piezoelectric sensor 61 is structured so that the top and bottom surfaces of the piezoelectric element 61a is placed between nickel-plated-electrodes. The electrode formed on the top surface is used as the output electrode 61b of the piezoelectric sensor 61 and the electrode formed on the bottom surface is used as the ground electrode 61c thereof. The electrode 61c is assumed as a potential surface of the piezoelectric sensor 61. The surface of the ground electrode 61c is then bonded and fixed to the distortion detecting spot, which is formed with a conductive material of the object member 65 with the use of a conductive adhesive 64.

Because the ground electrode 61c is grounded to the object member 65 directly in this case, the method has advantages that it is no need to solder any lead to the electrode and a general-purpose piezoelectric sensor is employable. In spite of this, the method still includes an anxiety; because the ground electrode 61c is possibly shorted with the output electrode 61b due to an adhesive extruded from the end of the bonding portion, the bonding must be done specially carefully. When in accordance with the bonding method example shown in FIG. 10, the higher the possibility of short-circuit becomes, the thinner the piezoelectric element becomes.

SUMMARY OF THE INVENTION

Under such the circumstances, it is an object of the present invention to provide a piezoelectric sensor that never sacrifices any of work properties, for example, even when a lead wire is to be soldered to one of a pair of electrodes of a piezoelectric sensor and the other electrode is to be bonded and fixed to a predetermined member with an adhesive.

It is another object of the present invention to make it efficient to bond the ground electrode of the piezoelectric sensor to the conductive portion of the object member with an adhesive so as to be fixed and connected electrically, thereby preventing a short-circuit that might occur between the two electrodes due to extruded and stuck adhesive.

It is further another object of the present invention to provide an easier method for testing whether or not the ground electrode is connected electrically to the conductive portion of the object member.

It is further another object of the present invention to provide a method for simplifying both wiring and assembling works for disposing the piezoelectric sensor to an actuator of a disk unit with the use of the above method.

The piezoelectric sensor, which is a first invention in this application, has a first electrode formed on a first surface of a thin plate-like piezoelectric element and a second-electrode formed on a second surface of the same piezoelectric element. The first electrode is formed with a conductive metallic material of more wetting properties than the second electrode and the second electrode is formed with a conductive metallic material of more adhesive properties than the first electrode.

For example, the first electrode may be plated with gold and the second electrode may be plated with nickel. According to the method for fixing the piezoelectric sensor, which is another invention in this application, in order to bond the piezoelectric sensor with an adhesive to an object member whose distortion is to be detected, a predetermined portion of the object member is formed with a conductive material and the second electrode of the piezoelectric sensor is bonded to the predetermined portion with a non-conductive adhesive, then pressed with a predetermined pressure so as to be hardened and connected.electrically. In this case, the adhesive may be an anaerobic photo-setting one.

The actuator, which is further another invention in this application, comprises an actuator arm held rotationally within a predetermined range and composed at least partially of a conductive material; a moving coil held at the actuator arm; a stator magnet cooperating with the moving coil to compose a voice coil motor and rotate the actuator arm; and the above piezoelectric sensor. The second electrode of the piezoelectric sensor is bonded to a predetermined conductive portion formed with the conductive material with a non-conductive adhesive, then pressed with a predetermined pressure so as to be hardened and connected electrically.

The disk unit, which is further another invention in this application, includes the above actuator and a control circuit for controlling a current flowing in the moving coil so as to suppress the distortion of the actuator arm according to a detected signal from the piezoelectric sensor. The predetermined conductive portion is grounded.

Furthermore, according to the method for checking connections, which is further another invention in this application, a test result of the electrical connection between the second electrode of the piezoelectric sensor bonded with the above fixing method and the predetermined portion of the object member is judged by the comparison of the capacities, capacity between both electrodes of the piezoelectric sensor before connection with capacity between the first electrode of the piezoelectric sensor and the predetermined portion of the object member after connection.

The above as well as additional objects, features, and advantages of the present invention will become apparent in the following detailed written description.

DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DESCRIPTION OF ILLUSTRATIVE EMBODIMENT

Figure 1:
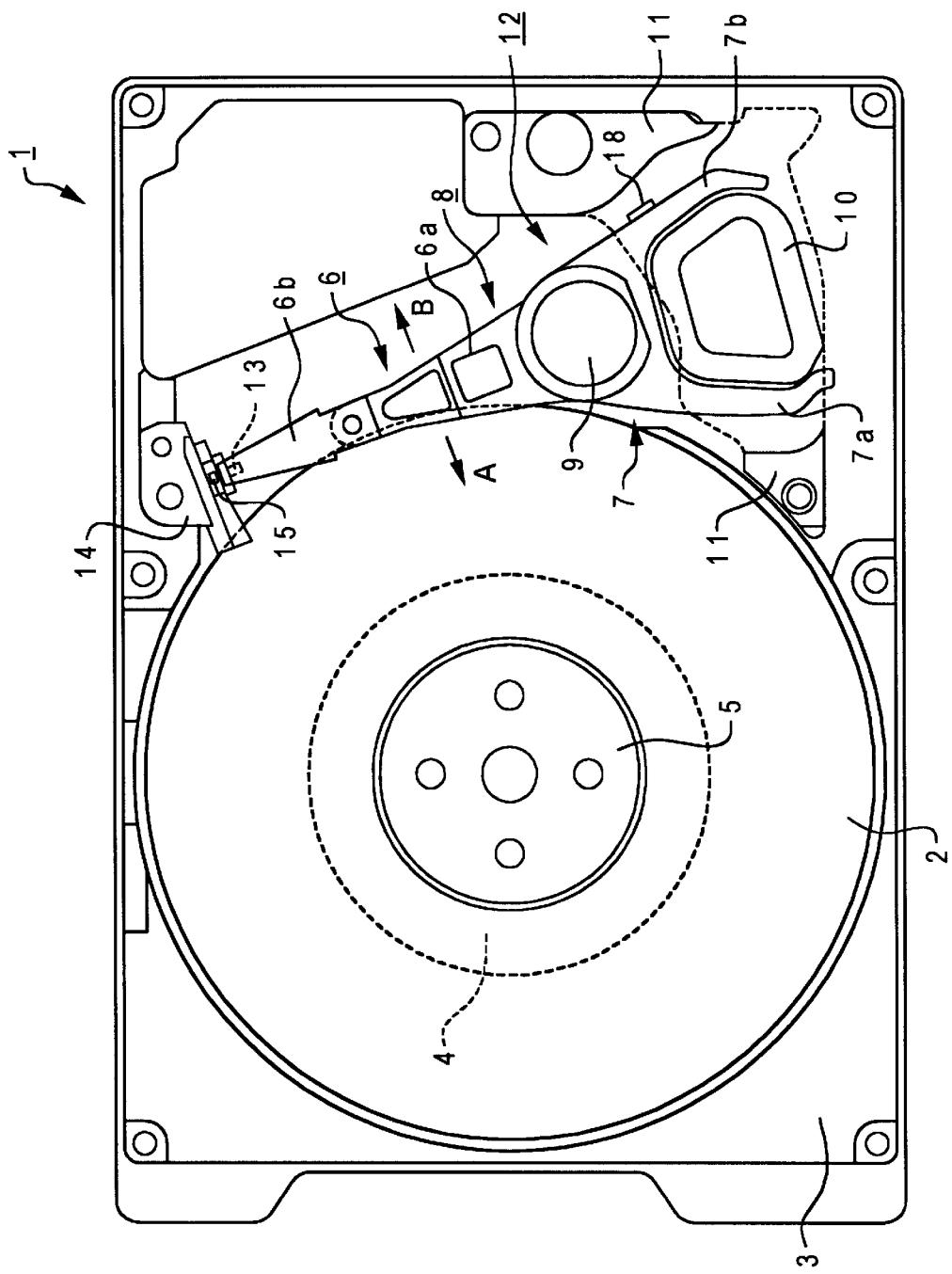
FIG. 1 is a top view of a hard disk unit in an embodiment of the present invention.
Figure 2:
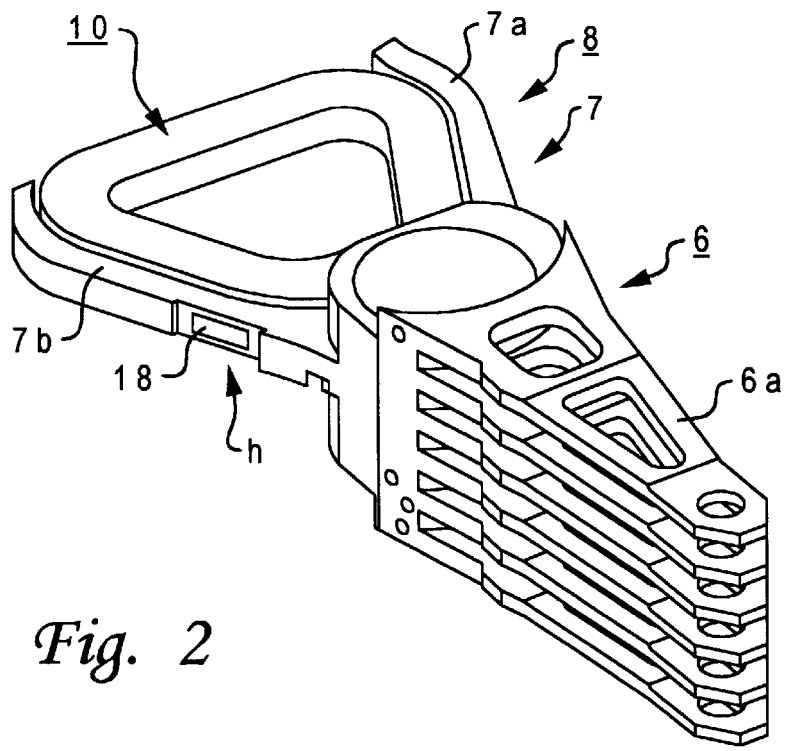
FIG. 2 is a perspective view of the main portion of an actuator arm for holding a flat coil.

With reference now to the figures and in particular with reference to FIG. 1, there is depicted a top view of a hard disk unit 1 in an embodiment of the present invention. FIG. 2 shows a perspective view of the main portion of an actuator arm 8 that holds a flat coil 10.

In FIG. 1, a disk 2 is held unitarily at a hub 5 of a spindle motor 4 disposed on a base 3 and the disk 2 is rotated by the spindle motor. Actually, there are a plurality of disks 2, which are disposed in the axial direction of the spindle motor and stacked with a spacer (not illustrated) therebetween respectively at predetermined spaces.

The actuator arm 8 comprises a suspension arm assembly 6 (FIG. 2) and a coil support assembly 7. In the suspension arm 6 are formed arms 6a (FIG. 2) in six layers with a space therebetween respectively at predetermined spaces and hold a suspension unit 6b (FIG. 1) at the tip. The actuator arm 8 is held rotationally by a rotary shaft 9 implanted in the base 3 and erected therefrom.

At the coil support assembly 7 are formed coil supports 7a and 7b for holding the flat coil 10 at the opposite side of the suspension arm assembly 6 with respect to the rotary shaft 9. The flat coil 10 configures a voice coil motor (hereafter, to be referred to as the VCM) in cooperation with a stator magnet (not illustrated) fixed to an upper stator magnet holder 11 (FIG. 1) fixed to the base 3 above the flat coil 10 and a stator magnet 16 fixed to a lower stator magnet holder 17 (FIG. 3) to be described later.

Figure 3:
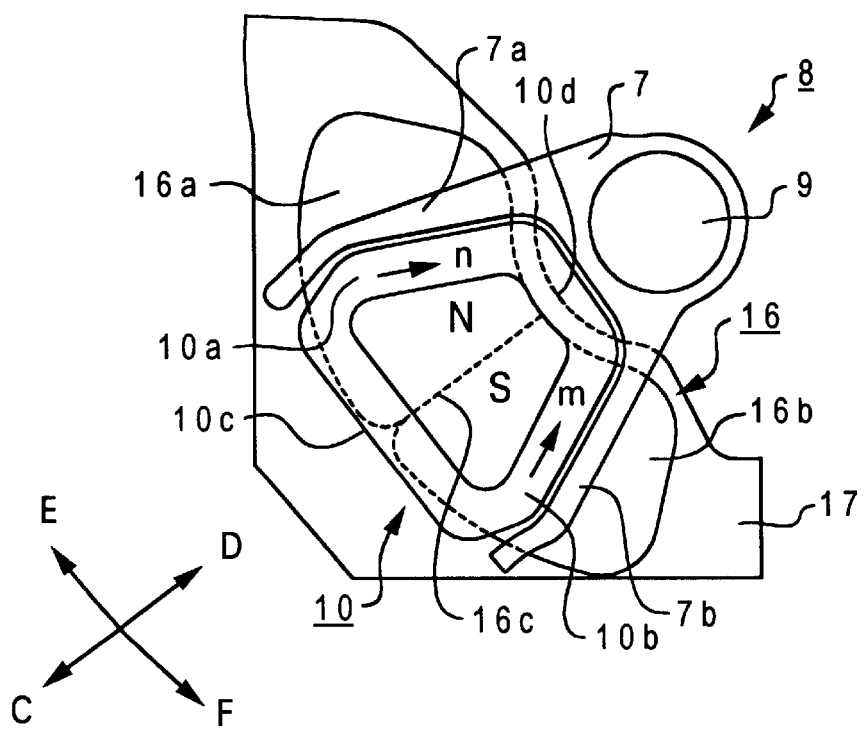
FIG. 3 is a configuration of the main portion of a VCM of an actuator.

The VCM rotates the actuator arm 8 in the direction of the arrow A or B. This VCM is combined with the actuator arm 8 to compose an actuator 12. The upper stator magnet holder 11 is notched at the upper main portion as shown in FIG. 1 and the external shape is indicated with a broken line. Also under the flat coil 10 is disposed the lower stator magnet holder 17 for holding the stator magnet 16 on the base 3 as shown in FIG. 3. The magnet holder 17 holds the stator magnet 16.

A slider 13 is held at the tip of the suspension unit 6b (FIG. 1) held by the arm 6a of each of the six layers. At the predetermined position of the slider 13 is disposed each head (not illustrated) for reading and writing signals. If the actuator arm 8 rotated in the direction of the arrow A moves onto the recording surface of a rotating disk 2, each slider 13 flies above the recording surface of the corresponding one of a plurality of the disks 2 so that each head faces a recording surface at a predetermined space.

A lamp 14 (FIG. 1) disposed on the base 3 receives the tab 15 on itself when the actuator arm 8 is unloaded and stays at the home position. The tab is formed at the tip of each suspension unit 6b. The piezoelectric sensor 18 detects expansion or contraction of a portion where the coil support 7b is disposed, then converts the detected distortion to an electric signal to be output. coil support 7b is the object member disposed to be described later.

FIG. 3 shows a configuration of the VCM of the actuator 12 (FIG. 1) in an embodiment of the present invention. To simplify the illustration, the suspension arm assembly 6 (FIG. 1) of the actuator arm 8 is omitted here. In addition, although only the stator magnet 16 is illustrated in FIG. 3, actually a heteropolar stator magnet is also disposed on the upper stator magnet holder 11 (FIG. 1) as described above so as to face the stator magnet 16 via a flat coil 10. The stator magnet 16 is held at the lower stator magnet holder 17 disposed on the base 3 (FIG. 1).

The flat coil 10 comprises some portions; side rims 10a and 10b extended along different lines in the radial direction so that its center becomes the rotation center of the actuator arm 8, an outer rim 10c extended approximately along an arc whose center is the rotation center of the actuator arm 8, and an inner rim 10d extended approximately along an arc whose center is the rotation center of the actuator arm 8. The coil 10 is coiled approximately flatly so as to form a closed path with the rims described above. The coil 10 is thus formed approximately like a trapezoid with its four sides.

The lower stator magnet holder 17 holds the stator magnet 16 in the lower portion of the flat coil 10. This stator magnet 16 is formed so that the side rims 10a and 10b of the flat coil 10 cover most of their moving areas respectively and the N pole 16a and the S pole 16b are united with a boundary 16c therebetween as shown in FIG. 3. The upper stator magnet is also composed in the same way. In this case, however, the N pole is formed so as to face the lower S pole and the S pole is formed so as to face the lower N pole respectively.

As described above, the flat coil 10 is disposed so as to generate an electromagnetic action between the stator magnet 16 and itself. Therefore, if a current flows in the flat coil 10 in the direction of the arrow m, then a force is applied to each of the side rims 10a and 10b in the direction of the arrow E which indicates its rotating direction. The actuator 8 can thus be rotated clockwise. On the other hand, if a current flows in the flat coil 10 in the direction of the arrow n, the side rims 10a and 10b of the flat coil 10 receive a force respectively in the direction indicated with the arrow F (rotating direction), so the actuator 8 is rotated counter-clockwise. The flat coil 10 cooperates with the stator magnet 16 such way to rotate relatively to each other. This is why the coil 10 is also referred to as a moving coil.

Figures 4A, 4B, 4C:
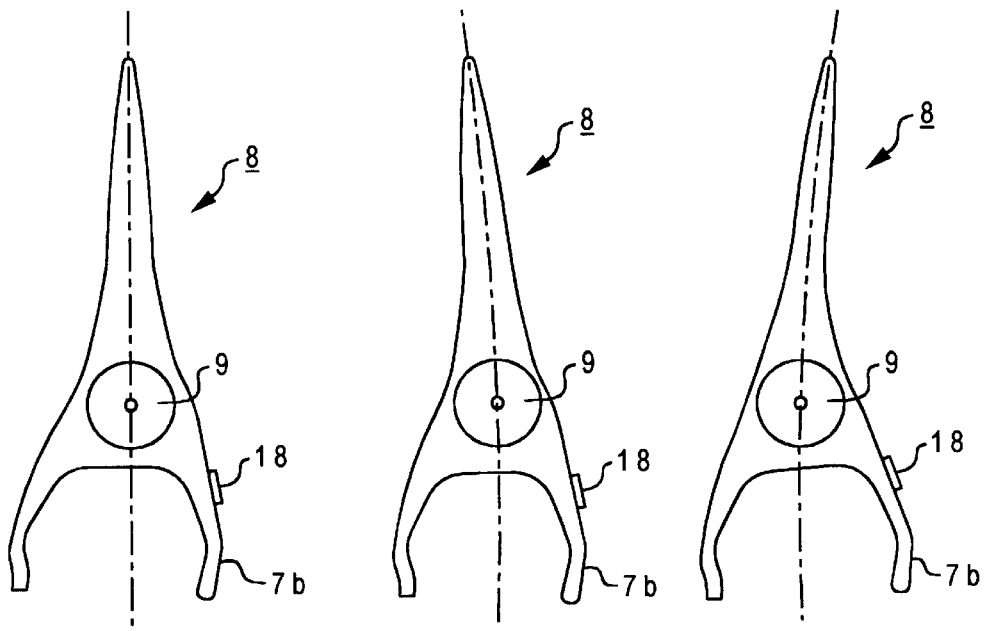
FIG. 4 illustrates a distortion of the actuator arm 8 caused by resonance of the butterfly mode.

The rotary actuator arm composed as described above has a resonance point referred to generally as a butterfly mode. FIG. 4 is an explanatory view for how the actuator arm 8 is distorted by resonance. FIG. 4(a) shows the actuator arm 8 before it is distorted and FIG. 4(b) shows the actuator arm 8 warped to the left. FIG. 4(c) shows the actuator arm 8 warped to the right. The piezoelectric sensor 18 fixed to the coil Support 7b is set so as to detect expansion in a left-warp and outputs an expansion/contraction signal from the output electrode to be described later. The signal includes a plus voltage on a level corresponding to the expansion. The sensor 18 detects contraction in a right-warp and outputs an expansion/contraction signal from the output electrode. The signal includes a minus voltage on a level corresponding to the contraction.

Figure 5:
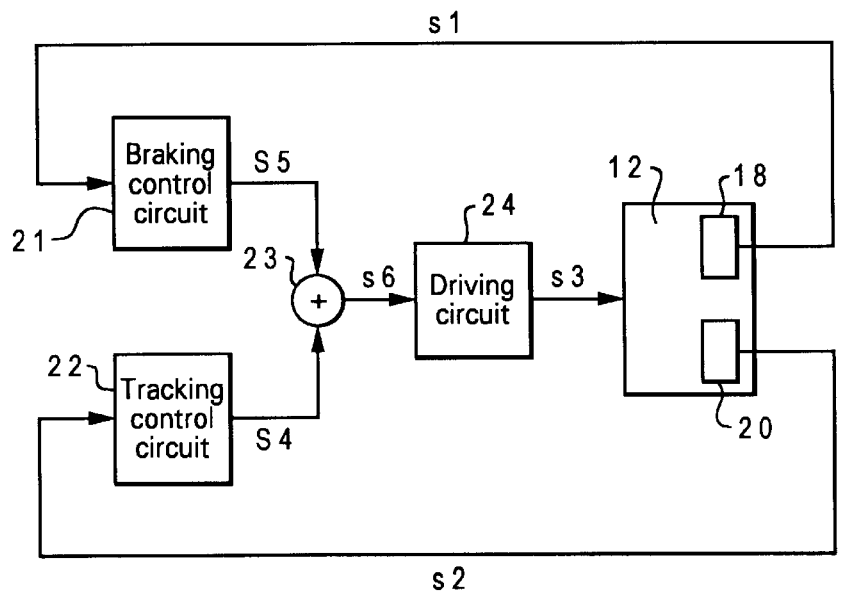
FIG. 5 is a block diagram of a control system for controlling the actuator.

FIG. 5 is a block diagram for an example of a control system for controlling the actuator 12 configured as described above in a hard disk unit of the present invention. The actuator 12 outputs a reproduction signal s2 received from a head 20 and an expansion/contraction signal s1 output corresponding to the expansion/contraction of an object member detected by the piezoelectric sensor 12. A tracking control circuit 22 takes out tracking error information from the reproduction signal s2 and outputs an operation signal s4 to an adder 23. The operation signal s4 is used to control the tracking according to this error information.

A braking control circuit 21 receives the expansion/contraction signal s1 from the piezoelectric sensor 18 and outputs an operation signal s5 to the adder 23, thereby controlling the actuator 12 so as to suppress the expansion/contraction. The adder 23 adds up the operation signals s4 and s5, thereby generating an addition signal s6. A driving circuit 24 outputs a driving current s3 to the actuator 12 according to this addition signal s6 so as to be flown in the flat coil 10, thereby driving the VCM of the actuator 12. According to control system of the actuator 12 configured as described above, the actuator 12 can suppress the resonance of the butterfly mode thereof and controls the tracking of the hard disk unit ordinarily.

Next, another configuration of the piezoelectric sensor fixed to the coil support 7b in an embodiment of the present invention, as well as its fixing method will be described. The external size of the piezoelectric sensor 18 composed like a thin plate and used in this embodiment is small as shown below.

$$\text{Length(L)} \times \text{Width(W)} \times \text{Thickness(T)} = 4.0 \times 1.6 \times 0.19 \text{ mm}$$

Figure 6:
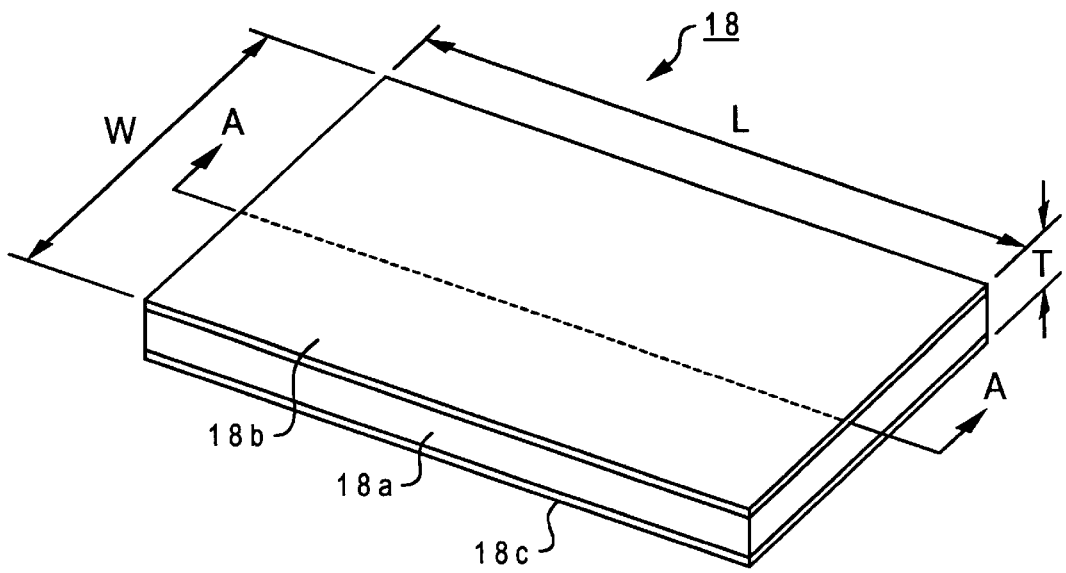
FIG. 6 is a perspective view of the piezoelectric sensor 18 from the position indicated with the arrow h in FIG. 2.

FIG. 6 shows a perspective view of the piezoelectric sensor 18 from the position indicated with the arrow h shown in FIG. 2. And, FIG. 7 shows a cross-sectional view of the sensor 18 at the line A shown in FIG. 6.

Figure 7:
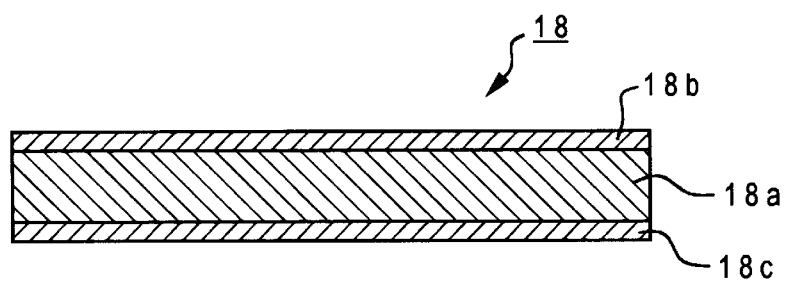
FIG. 7 is a cross-sectional view of the piezoelectric sensor in an embodiment of the present invention.
Figure 8:
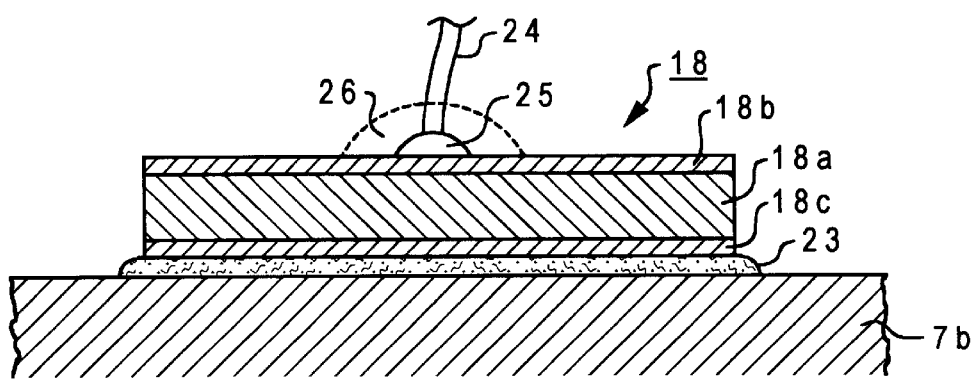
FIG. 8 illustrates how to fix the piezoelectric sensor of the present invention.
Figure 9:
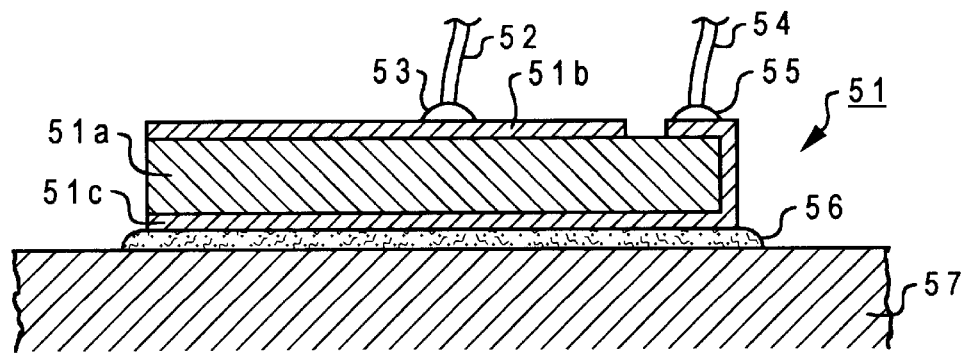
FIG. 9 illustrates how to bond the piezoelectric sensor of the present invention.
Figure 10:
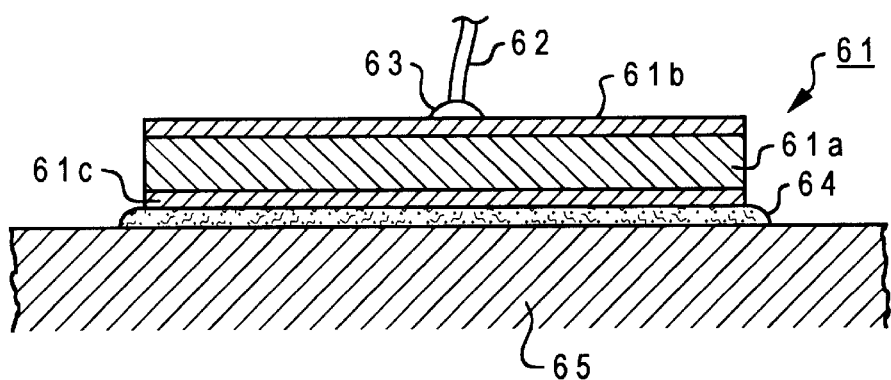
FIG. 10 illustrates how to bond the piezoelectric sensor of the present invention.

As shown clearly in FIG. 7, the piezoelectric sensor 18 is structured so that the top and bottom surfaces of the piezoelectric element 18a are placed between electrodes plated with different metals. As to be described later, the electrode on the top surface is plated with gold and used as the output electrode 18b of the piezoelectric sensor and the electrode formed on the bottom surface is plated with nickel and used as the ground electrode 18c, which is assumed as a reference potential surface of the piezoelectric sensor. this piezoelectric sensor 18 is fixed at a predetermined portion of the coil support 7b formed, for example, with conductive aluminum and grounded, the surface of the ground electrode 18c of the piezoelectric sensor 18 is bonded to the predetermined portion with a non-conductive adhesive 23. At this time, if the layer of the non-conductive adhesive 23 is thinned enough, the roughness of both adhesive surfaces functions effectively to directly contact and connect the coil support 7b to the ground electrode 18c electrically.

To make the adhesive layer as thin as possible, an anaerobic photo-setting adhesive is used. The adhesive is low in viscosity and fluid enough for excellent workability. For example, 326LV/UV (trade name), manufactured by LOCTITE Inc.®, is a suitable adhesive. The ground electrode 18c is plated with nickel, which has excellent adhesion, when such an anaerobic photo-setting adhesive is used.

An anaerobic photo-setting adhesive is an adhesive having both anaerobic (anaerobic hardening) and photo-setting properties. Epoxy (meta) acrylate, etc. are well known as such the adhesive. Anaerobic (anaerobic hardening) means a property that two adjacent surfaces are polymerized and hardened when the air is shut out from between them.

This is why such the photo-setting property is used (for example, by irradiating an ultra-violet ray (UV)) to harden the periphery of the object member (exposed portion which is not hardened, that is, an extruded portion), thereby shutting out the air from the object so that the anaerobic adhesive is hardened and the member is hardened and adhered entirely. Such an adhesive having both anaerobic (anaerobic hardening) and photo-setting properties will thus enable things to be done favorably.

There is also another method employable as a complementary means so that both photo-setting property and thermosetting property are employed to rise the temperature to make the adhesion perfect after the object is photo-set quickly. As a result of testing, it was found that the electrical resistance between the coil support 7b and the ground electrode 18c became about 0.5 to 0.9Ω, which was enough to satisfy the requirements on those conditions when a load of about 1.9 N was applied to the adhesive surface while the adhesive was setting.

On the other hand, a lead wire 24 was soldered to the output electrode 18b. The lead wire was used to lead the expansion/contraction signal described above. In addition, the adhesive 26 covered around the soldered portion so as to prevent the cut-off of the lead wire. This output electrode 18b was plated with gold which has excellent wettability for solder.

As described above, in case of the piezoelectric sensor 18 of the present invention, one electrode is plated with nickel for excellent adhesion by an adhesive, and the other electrode is plated with gold for excellent wettability by solder. Consequently, the sensor 18 allows the bonding and soldering works to be done easily, as well as marking for identifying those electrodes to be omitted, since they are already colored differently (gold and gray). It is thus not only possible to reduce errors in the manufacturing processes, but also to reduce the manufacturing cost.

Furthermore, because the piezoelectric sensor of the present invention is fixed so that the ground electrode 18c is bonded directly and connected electrically to the conductive coil support 7b with a non-conductive adhesive, no short-circuit occurs between them even when the adhesive is extruded from the end of the bonded portion and stuck there so as to connect the ground electrode 18c to the output electrode 18b.

Next, an electrical connection checking method of the present invention will be described. This method is applied for whether or not the piezoelectric sensor 18 is connected electrically to the conductive coil support 7b after both items 18 and 7b are bonded with a non-conductive adhesive. Because it is very difficult to check an electrical resistance between the coil support 7b and the ground electrode 18c directly so as to check such the electrical connection therebetween, the capacity between the lead wire 24 (or the output electrode 18b) and the coil support 7b is measured.

As described above, because the piezoelectric sensor 18 is structured so that the top and bottom surfaces of the piezoelectric element 18a are placed between the output electrode 18b and the ground electrode 18c, the piezoelectric sensor 18 also has a capacitor property. The capacity of the piezoelectric sensor 18 itself configured such way is about 600 pF. the other hand, if the layer of the adhesive 23 is too thick to connect the ground electrode 18c to the coil support 7b electrically, both ground electrode 18c and coil support 7b with a non-conductive adhesive 23 therebetween have a capacitor property respectively. This state means that two capacitors are connected serially between the coil support 7b and the ground electrode 18c. The capacity between the coil support 7b and the ground electrode 18c thus becomes several tens of picofarads.

Like this, the capacity between the lead wire 24 (or the output electrode 18b) and the coil support 7b is reduced to a very small fraction of the normal value if the electric connection between the ground electrode 18c and the coil support 7b is imperfect. Consequently, after the piezoelectric sensor 18 is fixed, the capacity between the lead wire 24 (or the output electrode 18b) and the coil support 7b is measured and compared with the capacity between the electrodes 18b and 18c before the piezoelectric sensor 18 is fixed, thereby judging the checking result of the electrical connection between the ground electrode 18c and the coil support 7b.

According to an embodiment of the present invention, because a pair of electrodes of the piezoelectric sensor are formed with different materials selected appropriately to external connections, both electrodes can be connected to their counterparts without sacrificing either of the work properties, even when one electrode is to be soldered and the other electrode is to be bonded with an adhesive.

Furthermore, according to another embodiment of the present invention, because the ground electrode of the piezoelectric sensor is bonded to the conductive portion of the object member using a non-conductive adhesive, extruded adhesive never causes any short-circuit between those electrodes, thereby the bonding work can be done easily and the work efficiency is improved more.

Furthermore, because the piezoelectric sensor of the present invention is bonded to the actuator of the hard disk unit in the above embodiment with the use of the above method, the reference potential surface of the piezoelectric sensor is grounded directly via the coil support 7b of the actuator arm. One of the line materials can thus be omitted, thereby both wiring and assembly works can be simplified.

Furthermore, it is possible to judge whether or not the ground electrode of the piezoelectric sensor is connected electrically to the conductive portion of the object member, to which the piezoelectric sensor is to be bonded, by measuring the capacity between the output electrode and the conductive portion, operation failures to be caused by such an imperfect connection therebetween can be prevented in the hard disk unit that employs this piezoelectric sensor in the above embodiment.

While the invention has been shown and described with reference to a preferred embodiment, it will be understood by those skilled in the art that various changes in form and detail may be made therein without departing from the spirit and scope of the invention.

What is claimed is:

1. A piezoelectric sensor assembly, comprising:

a substrate;

a first electrode formed on a first surface of a piezoelectric element and a second electrode formed on a second surface of the piezoelectric element, such that the second electrode is bonded to the substrate and the first electrode is located opposite the substrate; wherein the first electrode is formed with a conductive metallic material with greater wettability than the second electrode;

the second electrode is formed with a conductive metallic material with greater adhesion than the first electrode; and wherein the first electrode is plated with gold and the second electode is plated with nickel.

2. A piezoelectric sensor assembly, comprising:

a substrate;

a piezoelectric element having a ground surface and an output surface;

a ground electrode mounted to the ground surface of the piezoelectric element, and bonded directly to the substrate;

an output electrode mounted to the output surface of the piezoeletic element opposite the ground electrode; wherein a the output electrode is formed with a conductive metallic material having greater wettability than the ground electrode, and the ground electrode is formed with a conductive metallic material having greater adhesion than the output electrode; and wherein a portion of the ground electrode wraps around a side of the piezoelettric element and is mounted to the output surface of the piezoelectic element in such a manner that the portion of the ground electrode is spaced apart from the output electrode.

* * * * *

UNITED STATES PATENT AND TRADEMARK OFFICE
CERTIFICATE OF CORRECTION

PATENT NO. : 6,604,431 B1  
DATED : August 12, 2003  
INVENTOR(S) : Eiji Soga et al.

It is certified that error appears in the above-identified patent and that said Letters Patent is hereby corrected as shown below:

Column 6,  
Line 58, please insert the word -- member -- between the words "object" and "so".

Column 8,  
Line 45, please correct the spelling of "electrode" to read -- electrode --.  
Line 54, please correct the spelling of "piezoeletic" to read -- piezoelectric --.  
Line 56, please remove the word "a" before the word "the".  
Line 62, please correct the spelling of "piezoelettric" to read -- piezoelectric --.  
Line 56, please remove the word "a" before the word "the".  
Line 63, please correct the spelling of "piezoelectic" to read -- piezoelectric --.

Signed and Sealed this

Sixth Day of January, 2004

JAMES E. ROGAN  
*Director of the United States Patent and Trademark Office*